United States Patent
Frey

(10) Patent No.: US 8,933,906 B2
(45) Date of Patent: *Jan. 13, 2015

(54) PATTERNED SUBSTRATES WITH NON-LINEAR CONDUCTOR TRACES

(75) Inventor: Matthew H. Frey, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 1017 days.

This patent is subject to a terminal disclaimer.

(21) Appl. No.: 13/019,678

(22) Filed: Feb. 2, 2011

(65) Prior Publication Data

US 2012/0194441 A1 Aug. 2, 2012

(51) Int. Cl.
*G06F 3/045* (2006.01)
*H05K 9/00* (2006.01)
*G06F 3/041* (2006.01)

(52) U.S. Cl.
CPC .............. *H05K 9/0096* (2013.01); *G06F 3/041* (2013.01); *G06F 2203/04112* (2013.01)
USPC .......................................... 345/174; 345/176

(58) Field of Classification Search
CPC ........... G06F 3/041; G06F 3/045; H05K 1/00; H05K 1/09
See application file for complete search history.

(56) References Cited

U.S. PATENT DOCUMENTS

| | | |
|---|---|---|
| 2,445,962 A | 7/1948 | Mell |
| 5,694,701 A | 12/1997 | Huelsman et al. |
| 6,030,708 A | 2/2000 | Ishibashi et al. |
| 6,297,811 B1 | 10/2001 | Kent et al. |
| 7,032,324 B2 | 4/2006 | Kolb et al. |
| 7,129,935 B2 | 10/2006 | Mackey |
| 7,189,360 B1 | 3/2007 | Ho |
| 7,288,946 B2 | 10/2007 | Hargreaves et al. |
| 7,368,161 B2 | 5/2008 | McGurran et al. |
| 2002/0130605 A1 | 9/2002 | Mueller et al. |
| 2007/0229817 A1 | 10/2007 | Wang et al. |

(Continued)

FOREIGN PATENT DOCUMENTS

| | | |
|---|---|---|
| CN | 101887324 | 11/2010 |
| EP | 1 781 077 A1 | 5/2007 |

(Continued)

OTHER PUBLICATIONS

Brown et al., "The physical and chemical properties of electroless nickel-phosphorus alloys and low reflectance nickel-phosphorus black surfaces", *J. Mater. Chem.*, 12, 2002, pp. 2749-2754.

(Continued)

*Primary Examiner* — Kenneth Bukowski
(74) *Attorney, Agent, or Firm* — Clifton F. Richardson

(57) ABSTRACT

The present disclosure provides an article having (a) a substrate having opposing first and second surfaces; and (b) a conductor micropattern disposed on the first surface of the substrate. The conductor micropattern has a plurality of traces defining a plurality of open area cells. The conductor micropattern has an open area fraction greater than 80% and a uniform distribution of trace orientation. Each of the traces is non-linear and has a trace width from 0.5 to 10 micrometer. The articles are useful in devices such as displays, in particular, touch screen displays useful for mobile hand held devices, tablets and computers. They also find use in antennas and for EMI shields.

26 Claims, 12 Drawing Sheets

(56) References Cited

U.S. PATENT DOCUMENTS

| | | |
|---|---|---|
| 2008/0062140 A1 | 3/2008 | Hotelling et al. |
| 2009/0194344 A1 | 8/2009 | Harley et al. |
| 2009/0218310 A1 | 9/2009 | Zu et al. |
| 2009/0219257 A1* | 9/2009 | Frey et al. .................. 345/173 |
| 2009/0219258 A1 | 9/2009 | Geaghan et al. |
| 2010/0028564 A1 | 2/2010 | Cheng et al. |
| 2010/0040842 A1 | 2/2010 | Everaerts et al. |
| 2010/0073323 A1 | 3/2010 | Geaghan |
| 2010/0123670 A1 | 5/2010 | Philipp |
| 2010/0136265 A1 | 6/2010 | Everaerts et al. |
| 2010/0156840 A1 | 6/2010 | Frey et al. |
| 2010/0170710 A1 | 7/2010 | Sasaki et al. |
| 2010/0300729 A1 | 12/2010 | Matsuda et al. |
| 2010/0300773 A1 | 12/2010 | Cordeiro et al. |
| 2010/0302201 A1 | 12/2010 | Ritter et al. |
| 2010/0328248 A1 | 12/2010 | Mozdzyn |
| 2011/0007011 A1 | 1/2011 | Mozdzyn |
| 2011/0102361 A1* | 5/2011 | Philipp .................. 345/174 |
| 2011/0148781 A1 | 6/2011 | Chen et al. |

FOREIGN PATENT DOCUMENTS

| | | |
|---|---|---|
| EP | 2 278 850 A1 | 1/2011 |
| EP | 2 286 992 A1 | 2/2011 |
| JP | 2006-339526 | 12/2006 |
| JP | 2006-344163 | 12/2006 |
| JP | 2007-308761 | 11/2007 |
| JP | 2007-335729 | 12/2007 |
| JP | 2008-117955 | 5/2008 |
| JP | 2009-212545 | 9/2009 |
| JP | 2010-108878 | 5/2010 |
| JP | 2010-160927 | 7/2010 |
| JP | 2010-186566 | 8/2010 |
| JP | 2010-205432 | 9/2010 |
| KR | 10-2010-0048931 | 5/2010 |
| KR | 10-2010-0048932 | 5/2010 |
| KR | 10-2010-0080368 | 7/2010 |
| KR | 100997712 | 12/2010 |
| WO | WO 03/094253 A2 | 11/2003 |
| WO | WO 03/105248 A1 | 12/2003 |
| WO | WO 2005/121940 A2 | 12/2005 |
| WO | WO 2007/114196 A1 | 10/2007 |
| WO | WO 2008/128073 A2 | 10/2008 |
| WO | WO 2009/108765 A2 | 9/2009 |
| WO | WO 2009/114683 A1 | 9/2009 |
| WO | WO 2009/139458 A1 | 11/2009 |
| WO | WO 2009/142150 A1 | 11/2009 |
| WO | WO 2010/013679 A1 | 2/2010 |
| WO | WO 2010/019528 A2 | 2/2010 |
| WO | WO 2010/078346 A1 | 7/2010 |
| WO | WO 2010/090487 | 8/2010 |
| WO | WO 2010/099132 A2 | 9/2010 |
| WO | WO 2011/002617 A1 | 1/2011 |
| WO | WO 2011/051952 | 5/2011 |
| WO | WO 2011/069114 | 6/2011 |
| WO | WO 2011/139593 | 11/2011 |

OTHER PUBLICATIONS

Cho et al., "A Black Metal-dielectric Thin Film for High-contrast Displays", *Journal of the Korean Physical Society*, vol. 55, No. 2, Aug. 2009, pp. 501-507.

Cui et al., "The physical and electrochemical properties of electroless deposited nickel-phosphorus black coatings", *Surface & Coatings Technology* 200 (2006), pp. 6808-6814.

Hsiao et al., "Antireflection coating on metallic substrates for solar energy and display applications", *Proc. of SPIE*, vol. 7786, 77860N-1, 2010 (9 pages).

Krasnov, "High-contrast organic light-emitting diodes on flexible substrates", *Applied Physics Letters*, vol. 80, No. 20, May 20, 2002, pp. 3853-3855.

Layani et al., "Transparent Conductive Coatings by Printing Coffee Ring Arrays Obtained at Room Temperature", $^{ACS}$NANO, vol. 3, No. 11, 2009, pp. 3537-3542.

Poitras et al., "Black layer coatings for the photolithographic manufacture of diffraction gratings", *Applied Optics*, vol. 41, No. 16, Jun. 1, 2002, pp. 3306-3311.

Poitras et al., "Design of high-contrast OLEDs with microcavity effect", *Optics Express*, vol. 16, No. 11, May 26, 2008, pp. 8003-8015.

Wendling et al., "Creating Anti-Reflective Nanostructures on Polymers by Initial Layer Deposition before Plasma Etching", *Plasma Processes and Polymers*, vol. 6, Issue Supplement 1, pp. S716-S721 (2009).

Schonberger et al., Large-area fabrication of stochastic nano-structures on polymer webs by ion- and plasma treatment, *Surface and Coatings Technology*, vol. 205, Issue Supplement 2, pp. S495-S497 (2011).

\* cited by examiner

PATTERNED SUBSTRATES WITH NON-LINEAR CONDUCTOR TRACES

BACKGROUND

The use of metal-based conductor mesh for application where light transmission and electrical conductance are needed is known in the art. Examples of such applications include shielding for electromagnetic interference for displays. In the industry, a mesh is typically understood to mean a pattern geometry having connected traces that are separated by open area to form cells.

It has been observed in the current work that some mesh designs, when integrated into a display and viewed under reflected, collimated light (such as in direct sunlight), may produce undesirable visual effects. Illustrative undesirable visual effects include, e.g., a starburst pattern for reflected light and bands of colored reflected light (similar to a rainbow) caused by light interference, each being observable when a mesh containing linear traces and a repeating cell geometry is disposed an unmodified substrate, such as a plastic film or glass. Illustrative examples of meshes with linear traces include those having hexagonal and square cells. Sparkle, which is an undesirable visual appearance of points of reflected light, can also appear for linear traced-based conductor meshes.

Some skilled in the art have attempted to reduce the visual appearance of overlaid mesh micropatterns by using wavy traces in producing a display, such as a touch screen display. See, e.g., PCT International Publication No. WO 2010/099132 A2 describing articles such as antennas, electromagnetic interference shields and touch screen sensors having a light transparent substrate and two conductive meshes, each having linear traces, where the first mesh overlays a second mesh in a certain configuration so as to minimize the traces' visibility.

SUMMARY

There is a desire to improve the visual appearance of the metal-based conductor meshes, in terms of reducing their visibility, when the mesh is integrated into a display and viewed under reflected, collimated light, such as in direct sunlight.

The present disclosure provides designs of conductor micropatterns that, when integrated into a display or device, reduce at least one of the undesirable visual effects, such as starburst, sparkle, halo and rainbow, when the display or device is viewed under collimated or nearly collimated light such as sunlight. In particular, the present disclosure sets forth conductor micropattern design that uses a uniform distribution of trace orientations, as defined by, e.g., a normal to the trace, across all directions within a plane of the micropattern, as further described herein.

In one aspect, the present disclosure pertains to an article comprising (a) a substrate having opposing first and second surfaces; and (b) a conductor micropattern disposed on the first surface of the substrate, the conductor micropattern comprising a plurality of traces defining a plurality of cells, wherein the conductor micropattern has an open area fraction greater than 80% and a uniform distribution of trace orientation; and wherein each of the traces is non-linear and has a trace width from 0.5 to 10 micrometer.

BRIEF DESCRIPTION OF THE DRAWINGS

The disclosure can be further described with reference to the following drawings, wherein.

Figure 1:
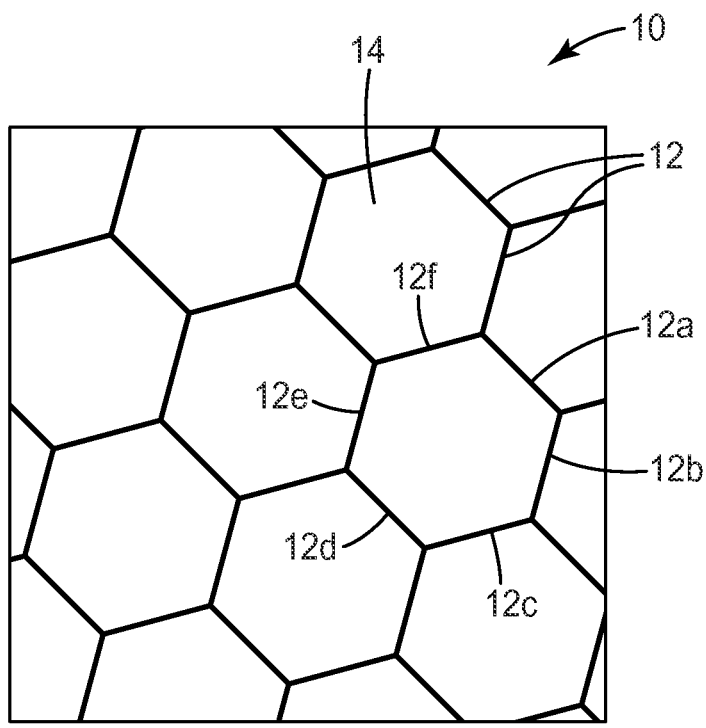
FIG. 1 is a top plan view of a schematic of a regular hexagonal micropattern.

These figures are not drawn to scale and are intended for illustrative purposes.

DETAILED DESCRIPTION

Unless otherwise indicated, all numbers expressing feature sizes, amounts and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art using the teachings disclosed herein.

The recitation of numerical ranges by endpoints includes all numbers within that range (e.g., 1 to 5 includes, 1, 1.5, 2, 2.75, 3, 3.80, 4 and 5) and any range within that range.

As used herein "micropattern" refers to an arrangement of dots, traces, filled shapes, or a combination thereof, each having a dimension (e.g. trace width) of no greater than 1 mm.

In preferred embodiments, the micropattern is a mesh formed by a plurality of traces defining a plurality of cells, each trace having a width of at least 0.5 microns and typically no greater than 20 microns. The dimension of the micropattern features can vary depending on the micropattern selection. In some favored embodiments, the micropattern feature dimension (e.g. trace width) is less than 10, 9, 8, 7, 6, or 5 micrometers (e.g. 0.5 to 5 micrometers or 1 to 3 micrometers). The traces useful in the present disclosure are non-linear.

As used herein, "visible light transparent" refers to the level of transmission of the unpatterned substrate or of the article comprising the micropatterned substrate, being at least 60% transmissive to at least one polarization state of visible light, where the percent transmission is normalized to the intensity of the incident, optionally polarized light. It is within the meaning of visible light transparent for an article that transmits at least 60% of incident light to include microscopic features (e.g., dots, squares, or traces with minimum dimension, e.g. width, between 0.5 and 10 micrometers, between 0.5 and 5 micrometers, or between 1 and 3 micrometers) that block light locally to less than 60% transmission (e.g., 0%); however, in such cases, for an approximately equiaxed area including the microscopic feature and measuring 1000 times the minimum dimension of the microscopic feature in width, the average transmittance is greater than 60%. The term "visible" in connection with "visible light transparent" is modifying the term "light," so as to specify the wavelength range of light for which the substrate or micropatterned article is transparent.

As used herein, "open area fraction" (or open area or percentage of open area) of a conductor micropattern, or region of a conductor micropattern, is the proportion of the micropattern area or region area that is not shadowed by the conductor. The open area is equal to one minus the area fraction that is shadowed by the conductor micropattern, and may be expressed conveniently, and interchangeably, as a decimal or a percentage. Area fraction that is shadowed by conductor micropattern is used interchangeably with the density of lines for a conductor micropattern. Illustrative open area fraction values useful in the present disclosure are those greater than 50%, greater than 75%, greater than 80%, greater than 90%, greater than 95%, greater than 96%, greater than 97%, greater than 98%, greater than 99%, 99.25 to 99.75%, 99.8%, 99.85%, 99.9% and even 99.95. In some embodiments, the open area of a region of the conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%.

As used herein, "trace" refers to the geometric element given by the intersection of two planes or by the intersection of a plane and a non-planar surface. The geometric element given by the intersection of two planes is described herein as linear (or, as a linear trace). The geometric element given by the intersection of a plane and a non-planar surface is described herein as non-linear (or, as a non-linear trace). A linear trace has zero curvature, or stated differently it has infinite radius of curvature. A non-linear trace has non-zero curvature, or stated differently it has a finite radius of curvature. Curvature or radius of curvature can be determined for any point along a trace, as is known in analytic geometry. Also, a normal can be constructed at a point that lies on a linear or non-linear trace, as is also known in analytic geometry.

Micropattern Designs

A number of different geometries or designs can be used for conductor micropatterns useful for present disclosure.

Turning now to the figures, FIG. 1 shows a top plan view of an illustrative geometry of a regular hexagonal conductor micropattern 10 that is formed by a plurality of linear traces 12. Six traces, 12a through 12f, form a cell 14 having an open area between the traces. As shown, each trace is of substantially equal length and each of the six internal angles is of substantially 120°.

Figure 2:
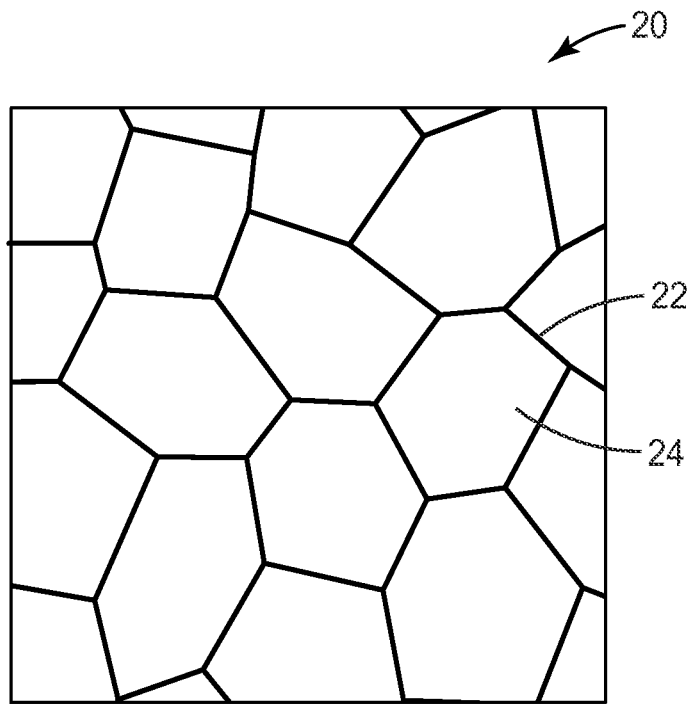
FIG. 2 is a top plan view of a schematic of a portion of a polygonal micropattern, referred to herein as a pseudorandom hexagonal micropattern.

FIG. 2 shows a top plan view of an illustrative geometry of a pseudorandom hexagonal conductor micropattern 20 formed by plurality of linear traces 22 defining a plurality of cells 24. In one method, this micropattern can be generated starting from the regular hexagonal pattern shown in FIG. 1 and displacing the vertices. In this design, the traces remain substantially linear. One characteristic of the micropattern 20, when generated by displacing vertices, is that a plot of each centroid's location for each cell indicates that the centroids lie approximately on a repeating array of positions. That is, the centroid's locations will not generally be randomized. In embodiments disclosed later herein, the locations of centroids are also specified to be randomized (not just the locations of vertices), in contrast to the general nature of the locations of the centroids for cells in FIG. 2.

Figure 3:
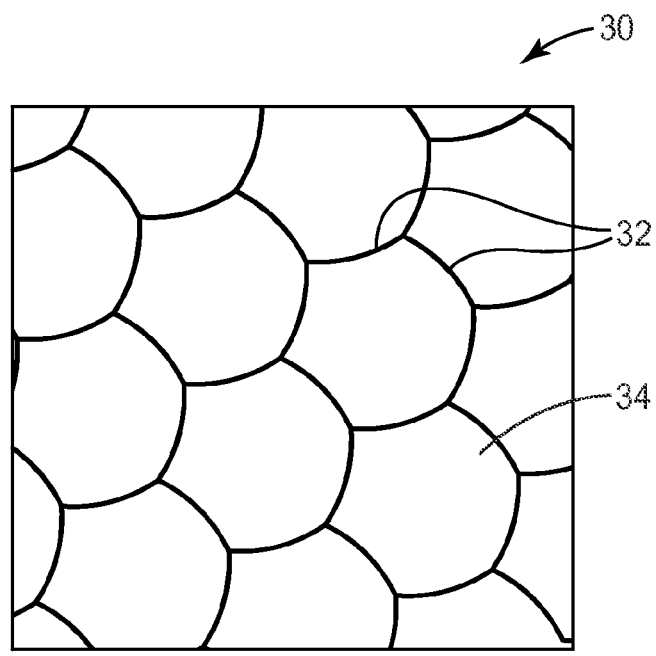
FIG. 3 is a top plan view of a schematic of a first illustrative non-linear micropattern design, based on a regular hexagon, and referred to herein as a partially curved hexagon micropattern.
Figure 3A:
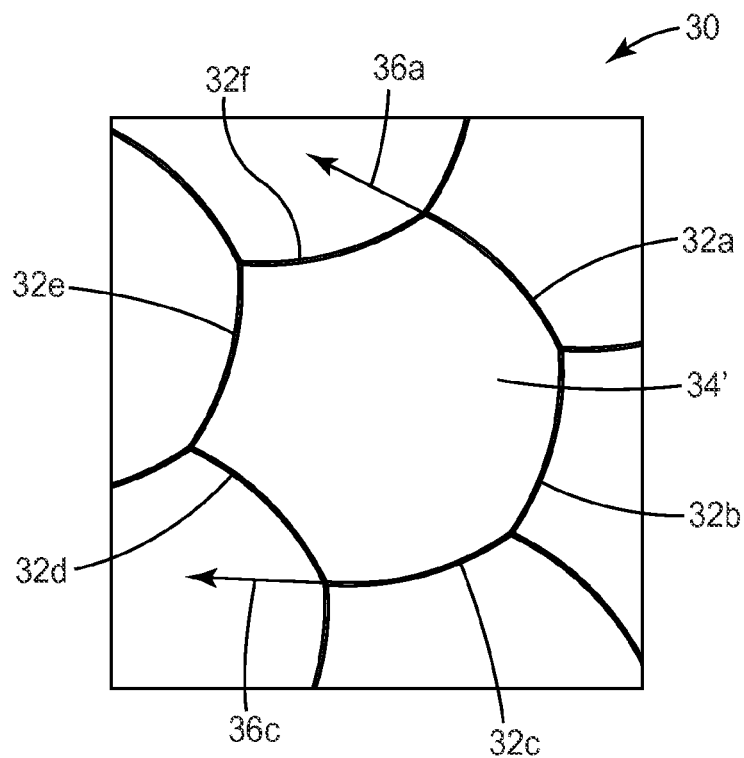
FIG. 3a is an exploded view of a few cells of the micropattern of FIG. 3.

FIG. 3 shows a top plan view of an illustrative geometry of a non-linear design, i.e., a partially curved hexagonal conductor micropattern 30 formed by a plurality of curved traces 32 defining a plurality of open area cells 34. In one method, this micropattern can be generated starting from the regular hexagonal micropattern shown in FIG. 1 and displacing the midpoint of each trace by some distance, e.g., by 10 micrometers. FIG. 3a shows a magnified cell 34' with six traces, 32a through 32f shown. One characteristic of the micropattern 30 is that tangents 36a and 36c for traces 32a and 32c respectively are generally not parallel to one another.

Figure 4:
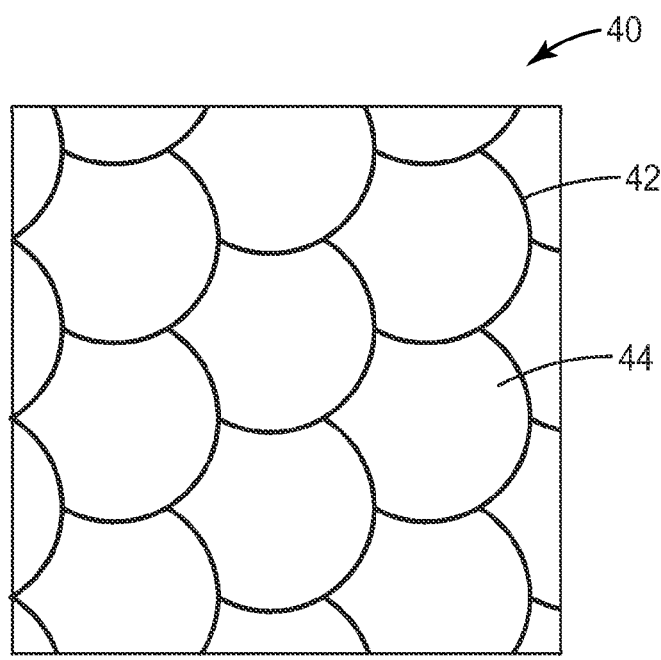
FIG. 4 is a top plan view of a schematic of a second illustrative non-linear micropattern design, based on a regular hexagon, and referred to herein as a fully curved hexagon micropattern.
Figure 4A:
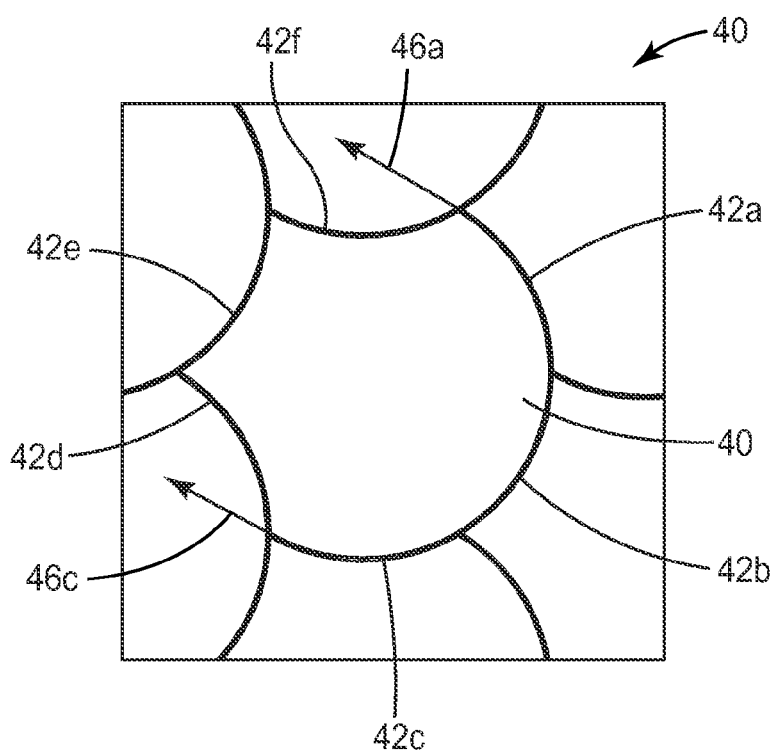
FIG. 4a is an exploded view of a few cells of the micropattern of FIG. 4.

FIG. 4 shows a top plan view of an illustrative geometry of another non-linear design, a fully curved hexagonal conductor micropattern 40 formed by a plurality of curved traces 42 defining a plurality of cells 44. In one method, this micropattern can be generated by decreasing the radius of curvature of the traces shown in FIG. 3 by, e.g., further displacing the midpoints of each trace. FIG. 4a shows a magnified cell 44' with six traces, 42a through 42f. One characteristic of the micropattern 40 is that tangents 46a and 46c for traces 42a and 42c respectively are generally parallel to one another.

Figure 5:
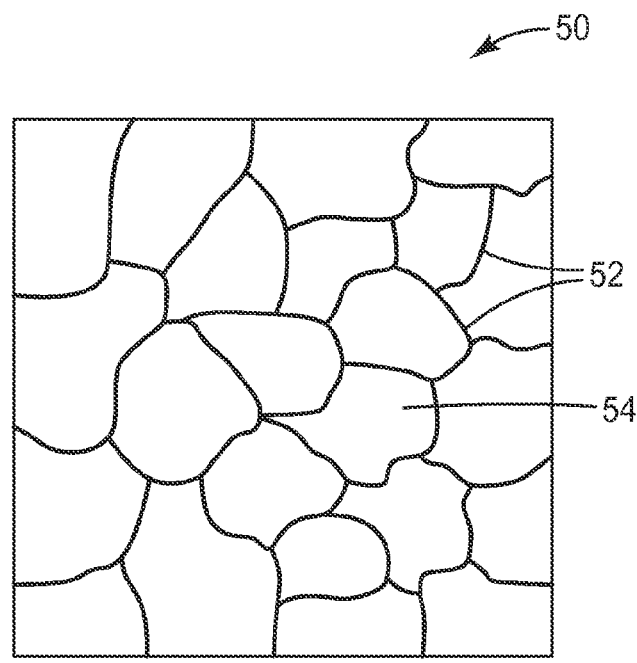
FIG. 5 is a top plan view of a third illustrative non-linear micropattern, a pseudorandom curved design.

FIG. 5 shows a top plan view of a portion of yet another non-linear design, a pseudorandom curved conductor micropattern 50 formed by a plurality of traces 52 defining a plurality of open area cells 54. This geometry includes cells defined by curved conductive traces, each having an exemplary width of 2 micrometers. The cells of a conductor micropattern with the pseudorandom curved design may have a varying number of edges or traces that define the cells, e.g., from four to eight edges. The sizes of the cells vary from an area of 2,000 square micrometers to an area of 70,000 square micrometers. For reference, the area of the regular hexagonal micropattern of FIG. 1 is 35,000 square micrometers. The positions of the cells, e.g., as defined by the centroid of each cell, do not lie on a regularly spaced array. The angular distribution of trace orientations for the pseuodorandom curved design, as measureable according to a procedure described herein and over an area of 1 centimeter by 1 centimeter, is substantially uniform. For example, in some embodiments, with respect to the uniformity of the distribution, no reference orientation can be established within the plane of the micropattern for which there are no normals to trace segments in the micropattern that exist within plus or minus 10 degrees of that reference orientation. In some cases, no reference orientation can be established within the plane of the micropattern for which there are no normals to trace segments in the micropattern that exist within plus or minus 5 degrees of that reference orientation. In some cases, no reference orientation can be established within the plane of the micropattern for which there are no normals to trace segments in the micropattern that exist within plus or minus 2 degrees of that reference orientation. Further with respect to the uniformity of the distribution, over, e.g., 1 centimeter by 1 centimeter area, there are no two 20 degree ranges of orientation in the plane of the micropattern for which the integrated density of the normals to the trace segments in the two ranges is different by more than 50 percent of the smaller of the two integrated density values. In some cases, over, e.g., 1 centimeter by 1 centimeter area, there are no two 20 degree ranges of orientation in the plane of the micropattern for which the integrated density of the normals to the trace segments in the two ranges is different by more than 25 percent of the smaller of the two integrated density values. In some cases, over, e.g., 1 centimeter by 1 centimeter area, there are no two 20 degree ranges of orientation in the plane of the micropattern for which the integrated density of the normals to the trace segments in the two ranges is different by more than 10 percent of the smaller of the two integrated density values. In some cases, over, e.g., 1 centimeter by 1 centimeter area, there are no two 10 degree ranges of orientation in the plane of the micropattern for which the integrated density of the normals to the trace segments in the two ranges is different by more than 10 percent of the smaller of the two integrated density values. In some cases, over, e.g., 1 centimeter by 1 centimeter area, there are no two 5 degree ranges of orientation in the plane of the micropattern for which the integrated density of the normals to the trace segments in the two ranges is different by more than 10 percent of the smaller of the two integrated density values.

As stated earlier, the conductor micropatterns that are useful in the present disclosure are those that have non-linear traces. However, only a slight modification of a linear trace to a non-linear trace (e.g., leading to a radius of curvature of, e.g. 10 centimeters) may not be sufficient to reduce the undesirable visual effects of starburst, sparkle and rainbow among others. Also, a slight modification of an ensemble of linear traces having, in aggregate, only two or three orientations to an ensemble of non-linear traces (e.g., leading to a radii of curvature of, e.g. 10 centimeters) that provide only narrow ranges of orientations may not be sufficient to reduce the undesirable visual effects. In an effort to quantify which micropattern designs comprising non-linear traces are useful in the present disclosure, the inventor has have formulated a concept of angular distribution of trace orientation and a procedure to measure it as described below.

Figure 14:
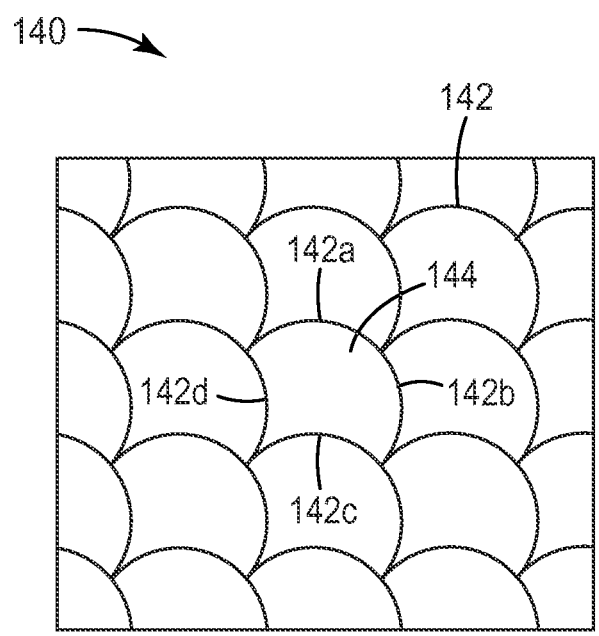
FIG. 14 is a top plan view of a third illustrative non-linear micropattern, referred to herein as a fully curved square micropattern.

The micropatterns of the present disclosure provide for the simultaneous minimization of a large number of potentially undesirable visual features with have been observed for other micropatterns, especially when combined with an information display (e.g., on a mobile phone, smart phone, tablet computer, laptop computer, desktop computer monitor, reading device, automotive display, or retail display). These potentially undesirable visual features include starburst, rainbow, and sparkle, as already described. The potentially undesirable features that are mitigated by the micropattern designs also include moiré interference with the pixel pattern of the display. The potentially undesirable features that are mitigated by the micropattern designs also include substantial blockage (e.g., 25%, 50%, or even 75%) of the viewability of individual pixels of the display (obscuring the information, but not necessarily leading to a moiré pattern). It is within the scope of this disclosure for the micropattern to be tilted (e.g., rotated or biased) with respect to a display, in order to optimize the mitigation of one or more of the potentially undesirable visual features. Tilting of the micropattern can be especially useful for minimizing moiré interference with a pixilated display. In some cases, a four-sided cell geometry, distributed on a square array of positions (e.g., fully curved square cell geometry) is convenient for minimization of moiré interference though tilting. FIG. 14 shows another exemplary non-linear micropattern that can be generated starting from a square and displacing the midpoint of each side of the square by some distance. Four traces, 142*a* to 142*d* are shown defining open area cells 144.

Angular Distribution of Trace Orientations

The orientations of the population of traces useful in the present disclosure can be quantified as a distribution that describes the relative concentration, density, presence, or abundance of trace segments of different orientations within the micropattern. This distribution can be used to describe the orientations of the population of traces in micropatterns that comprise linear traces or non-linear traces. Also, it can be used to describe the orientations of the population of traces in micropatterns that comprise repeating geometries (e.g., as in the case of a square or hexagonal micropattern, as in FIG. 1, or as in the cases of repeating cells defined by curved traces, as in FIGS. 3 and 4) or in micropatterns that comprise non-repeating geometries (e.g., as in the case of pseudorandom micropattern designs comprising linear (as in FIG. 2) or non-linear (as in FIG. 5) traces. The descriptor is the integrated micropattern trace length per unit area of micropattern, as a function of the orientation of a normal to the trace. Stated in another way, the descriptor can be expressed as the frequency distribution of orientations for trace segments (or the distribution of orientations of normals to the trace segments) that form a conductor micropattern. By "integrated," what is meant is the summation for all traces within a defined area that have the specified orientation.

In order to collect the above described frequency characteristics for orientations within conductor micropatterns having non-linear traces, the following procedure can be used. The procedure includes a series of manual drawing and measurement steps for a magnified print of the micropattern design on, for example, 11 inch by 17 inch paper. The characterization procedure include the steps of (a) printing a magnified rendering of the micropattern on paper, (b) partitioning the traces of the micropattern into at least 200 segments of approximately equal path length, (c) manually drawing a normal to each segment, (d) establishing an orientation frame of reference by establishing a 0 degree direction, and then (e) measuring the orientation of every normal with respect to the 0 degree direction (e.g., using a protractor). The traces, and thus the normals to the traces, can be specified using 180 degrees of angular range for the following reason. A trace that runs straight up and down can be arbitrarily described to be oriented up or down. A trace or its normal that is oriented upward is no different from a trace or its normal that is oriented downward. Thus, one cannot generate a trace that is oriented upward in any way different from a trace that is oriented downward (i.e., there is no meaning to a suggestion that the upward trace is different from the downward trace). Thus, the full range of possible trace segment orientations requires only 180 degrees of angular range.

Figure 6:
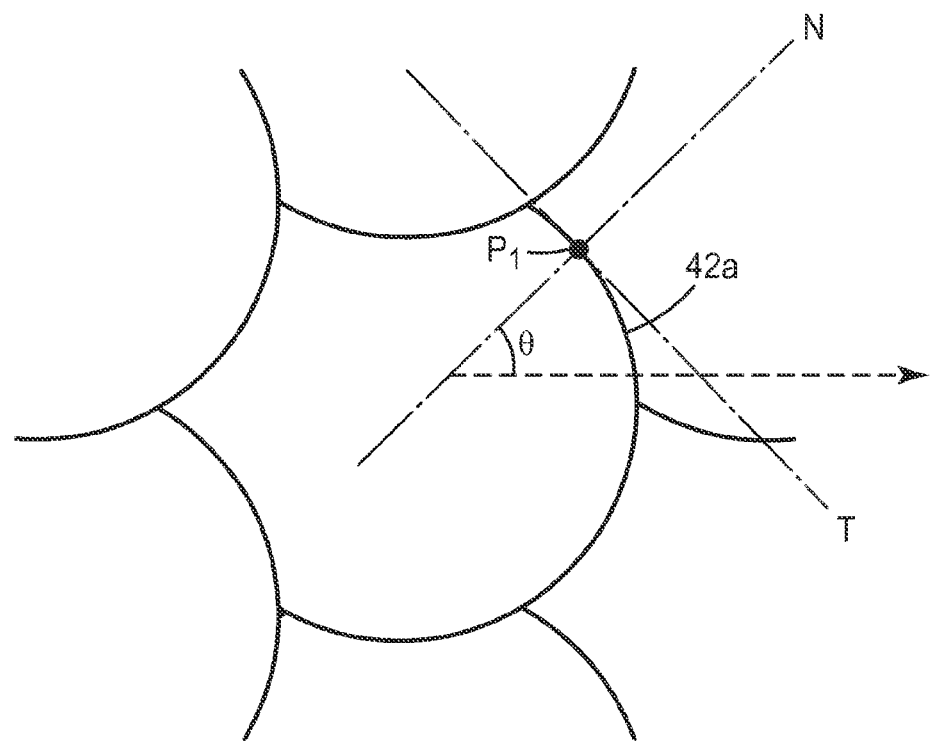
FIG. 6 shows a cell in a micropattern illustrating a measurement method to determine an orientation to a trace.

FIG. 6 shows a diagram of one full cell of the embodiment of FIG. 4 where angular orientation of a normal to a trace is being measured at trace segment $P_1$. For purposes of simplicity, only one of the 200 segments is shown. A normal line N to the trace segment $P_1$ is drawn as shown in the figure. A tangent line T is drawn intersecting both trace segment $P_1$ and normal line N. A reference zero degree line is drawn as shown by a dashed arrow. An angle theta (θ) can then be measured to determine the angle between the reference line and the normal line. This measurement is then repeated multiple times for segments similar to $P_1$ along each of the six traces. An arbitrary, but sufficiently large number of segments (in this case, 200 segments for statistically significant measurement) can be drawn for the cell. An approximately equal number of segments is drawn for each of the six traces.

The so-measured distribution of the orientation of the normal to a trace segment can be rendered by plotting a histogram of the orientation measurements. It should be noted that the distribution of the orientation of the normal to a trace segment provides a direct correlation to the distribution of the orientation of the trace segment itself. For micropatterns herein, the procedure was carried out for the traces making up at least one complete cell of the micropattern. For micropatterns having a single cell shape and size, replicated in two directions in order to yield a two-dimensional micropattern, characterization of the traces that make up a single cell is adequate to determine the distribution of trace orientations for the two dimensional micropattern over larger areas (for example over areas covering 10, 100, or even 1000 cells). For example, characterization of the traces that make up a single regular hexagonal cell measuring 200 micrometers in diameter is adequate to determine the distribution of trace orientations for a regular hexagonal micropattern of such cells measuring 1 millimeter by 1 millimeter, 1 centimeter by 1 centimeter, or even 1 meter by 1 meter. For micropatterns having multiple cell shapes or sizes, a sufficient number of cells should be characterized in order to determine the distribution of trace orientations for the overall micropattern with useful accuracy (e.g., where the so-measured distribution of trace orientations exhibits an $R^2$ correlation coefficient of at least 0.8, at least 0.9, at least 0.95, or even at least 0.99 when compared with the actual distribution of trace orientations over an area of the actual conductor micropattern of 1 millimeter by 1 millimeter, 1 centimeter by 1 centimeter, or even 1 meter by 1 meter).

Once the orientations of normals (represented by the angle θ) to the trace segments are measured, they can be binned into two micron bins thereby generating 90 bins from 0 to 180 degrees. Each bin includes an integer representing the number of measurements that yielded an orientation within the bin's two degree angular range. This binning procedure produces a discrete distribution of orientations. Finally, the standard deviation of the frequency values (standard deviation of measured frequency per 2 degree bin) can be calculated. For some distributions of the normal to the trace segment, and thus the distribution of trace orientation described herein to be considered uniform, the so calculated standard deviation is less than four. For some distributions of trace orientations described herein as uniform, the so calculated standard deviation is less than three. For some distributions of trace orientations described herein as uniform, the so calculated standard deviation is less than two. For some distributions of trace orientations therein uniform, the so calculated standard deviation is less than one.

Figure 7:
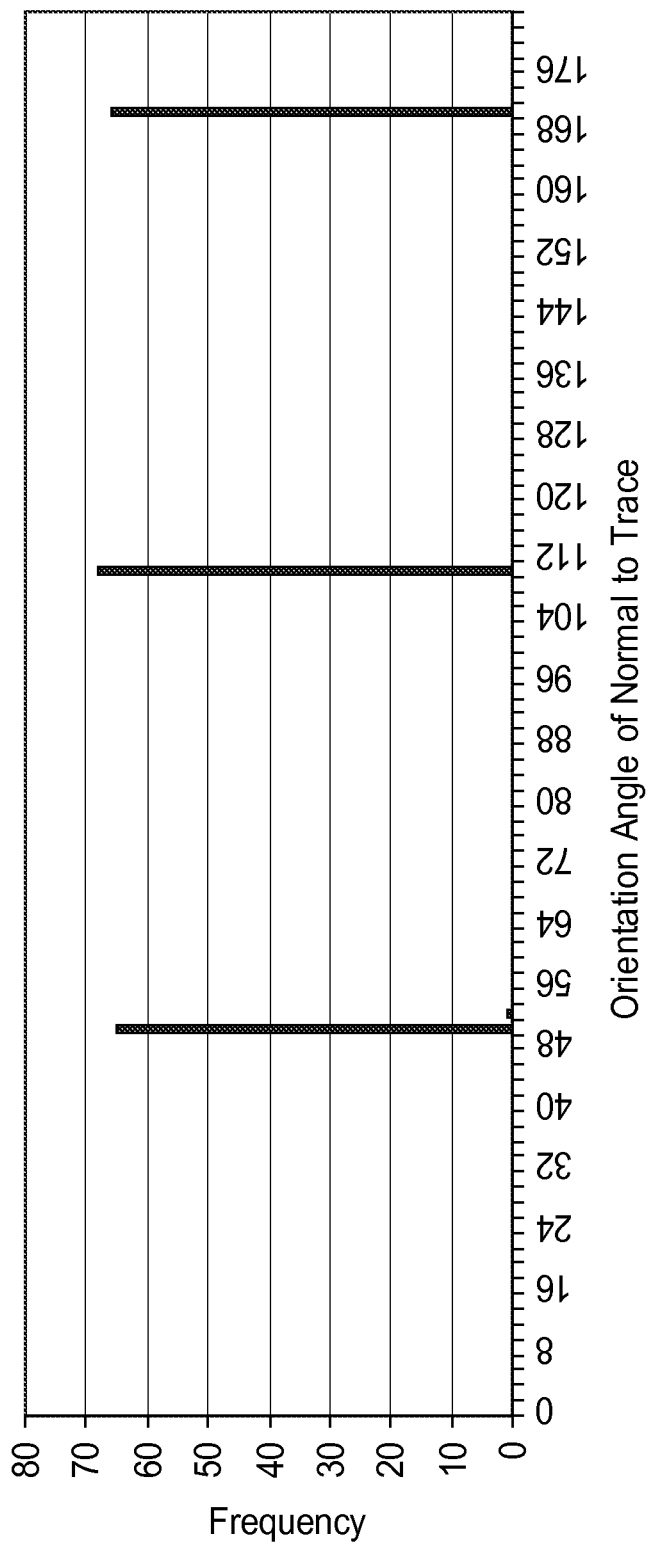
FIG. 7 shows a histogram of the orientation of normal to the trace segments for the micropattern of FIG. 1.

FIG. 7 shows a histogram of the angle θ for the multiple trace segments of the micropattern of FIG. 1, regular hexagon. Three distinct peaks results at three angles, each angle being about 60 degree apart from the other peak. It should be noted that the absolute value of the angle shown on the x-axis of the histogram is arbitrary in that the three peaks can occur at other angles, such as 40°, 100° and 160°, so long as they are about 60° degrees apart. The three peaks result because, with reference to FIG. 1, the orientation angle for the normals would be the same for traces 12a as 12d, 12b as 12e and 12c as 12f. For this micropattern, the standard deviation of measured frequency per 2 degree bin was measured as 11.6, a direct indication of the highly non-uniform.

Figure 8:
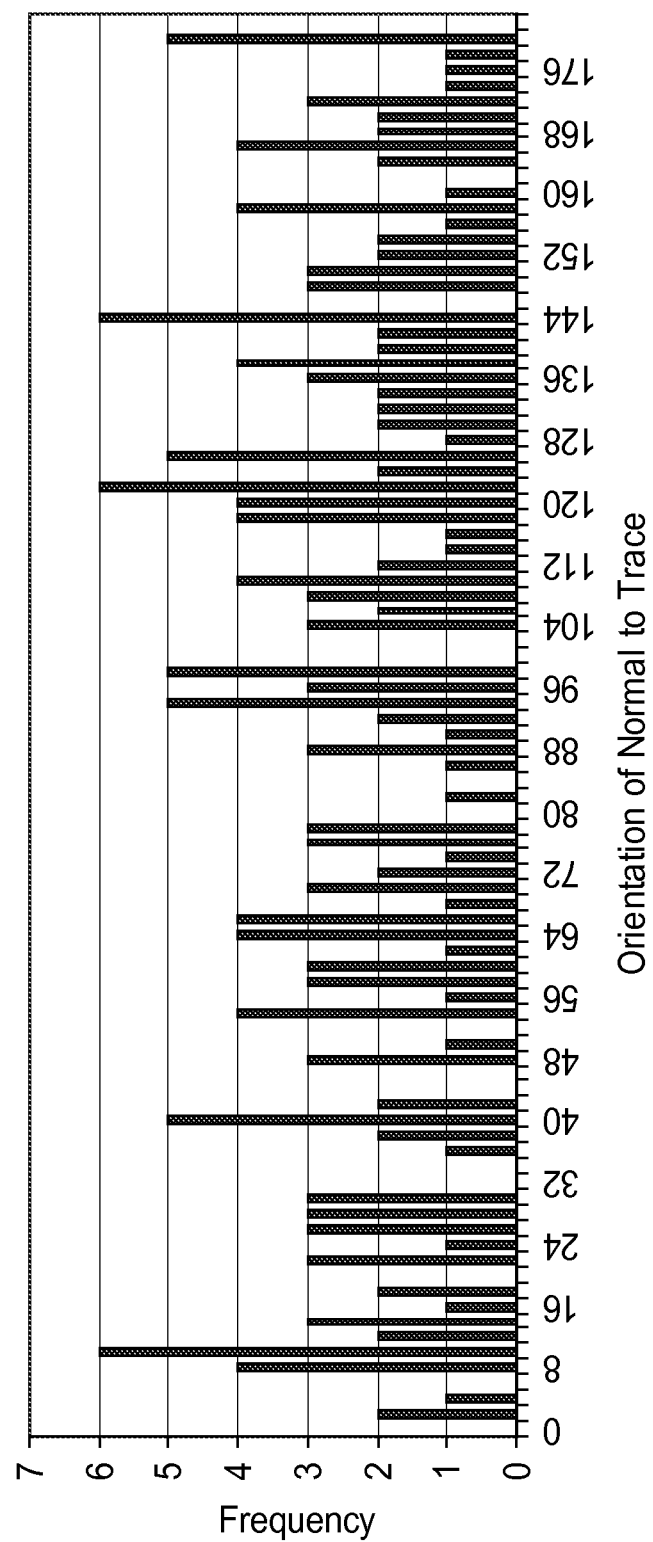
FIG. 8 shows a histogram of the orientation of normal to the trace segments for the pseudorandom hexagonal micropattern, a portion of which is illustrated in FIG. 2.
Figure 9:
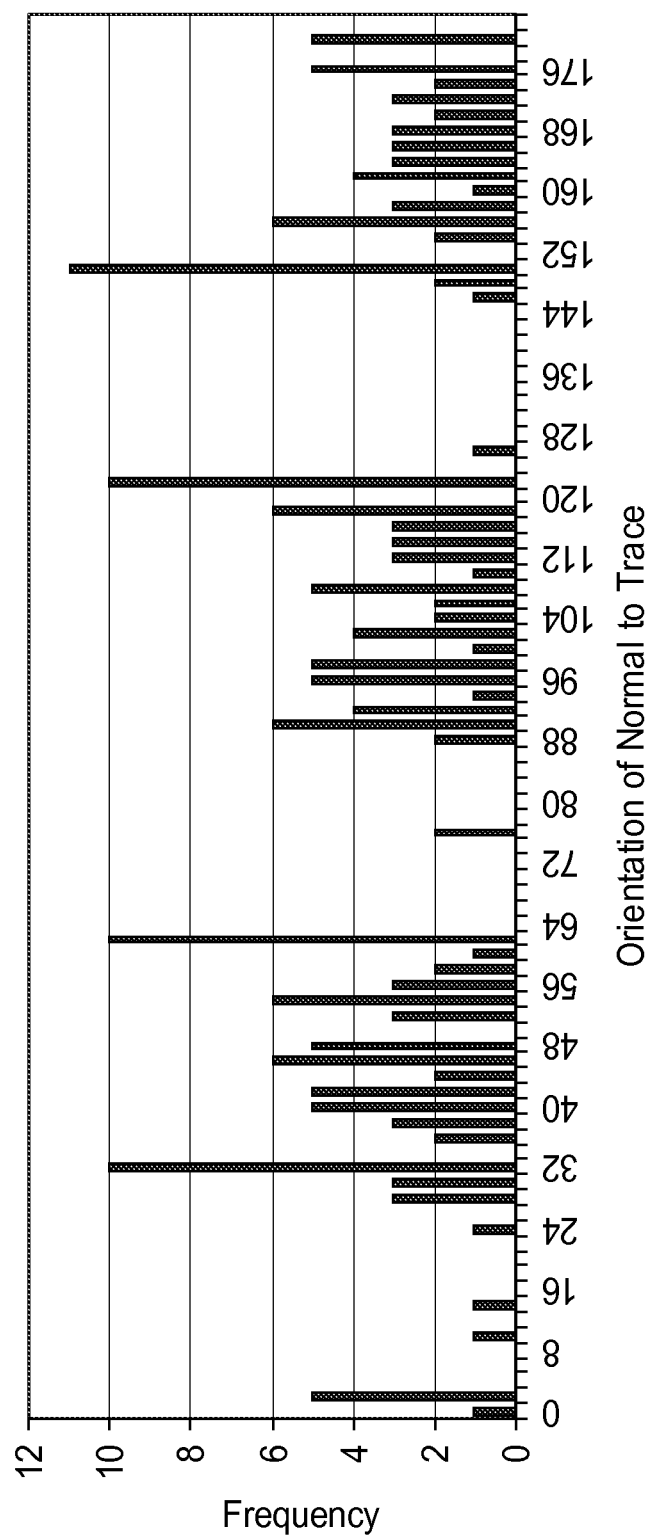
FIG. 9 shows a histogram of the orientation of normal to the trace segments for the partially curved hexagonal micropattern, a portion of which is shown in FIG. 3.
Figure 10:
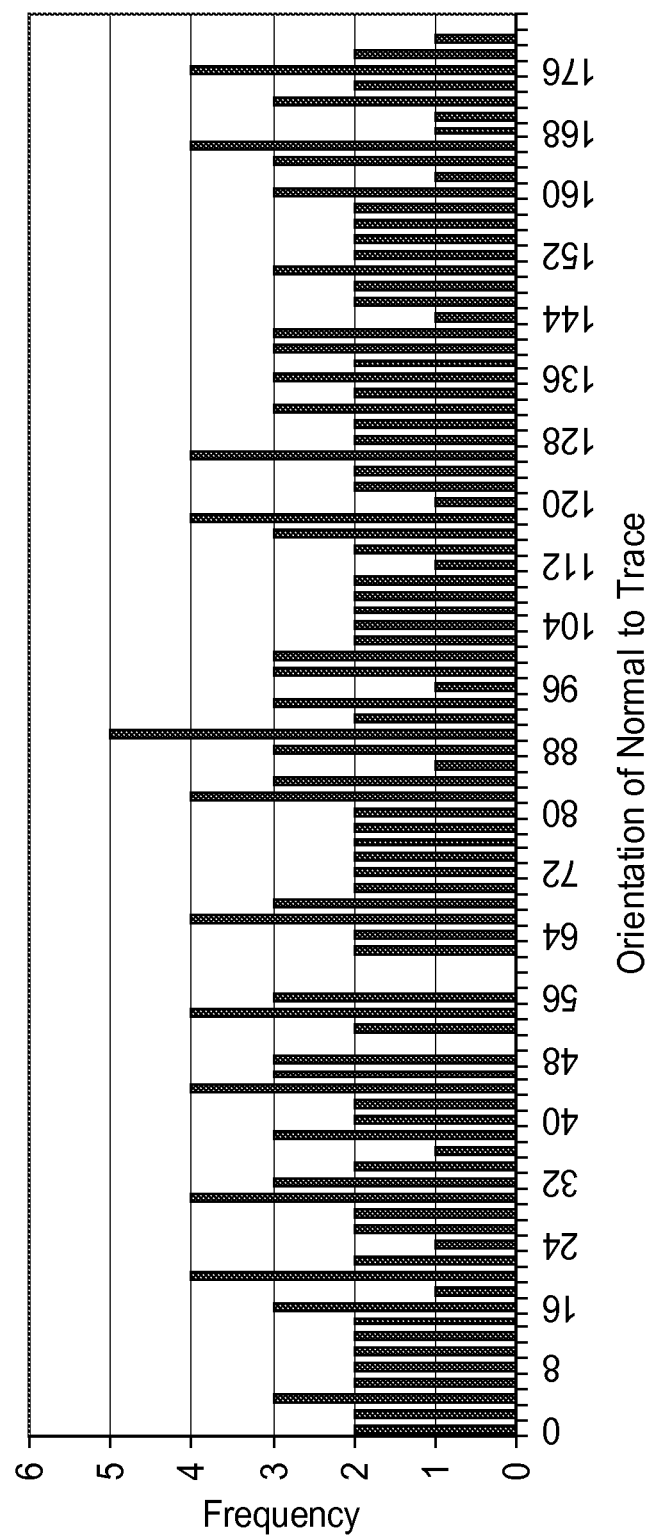
FIG. 10 shows a histogram of the angular distribution of the trace orientations for the fully curved hexagonal micropattern, a portion of which is shown in FIG. 4.

FIGS. 8, 9 and 10 show histograms of the angle θ for the pseudorandom hexagon micropattern of FIG. 2, the partially curved micropattern of FIG. 3 and the fully curved micropattern of FIG. 4 respectively. Each of these histograms has a broader distribution of angle θ as compared to the histogram for the micropattern of FIG. 1 with the histogram of FIG. 10 having the most uniform distribution of the four micropatterns. Furthermore, the standard deviation of these histograms is 1.6 (FIG. 8), 2.6 (FIG. 9) and 1.0 (FIG. 10).

Further describing the distribution of trace segment orientations within a conductor micropattern having non-linear traces, it is within the scope of a micropattern described herein to have a uniform distribution and yet have some orientations or small ranges of orientations not represented in the distribution. That is, a micropattern having an absolutely uniform distribution of trace or trace segment orientations across all 180° of possible orientations within a given area of the micropattern is not outside the scope of micropatterns described herein to have a "uniform distribution" by removal of a single trace (or trace segment) or by removal of all traces within a narrow range of angles, for example over a 5° range of angles, or for example over a 2 degree range of angles.

With reference to the procedure described above for measuring (approximately 200 measurements) and binning (2° bins) the frequencies of fractional trace segment orientations, the pseudorandom curved micropattern (FIG. 5) may be designed so as to have a standard deviation of measured frequency per 2 degree bin of less than 5, less than 4, less than 3, less than 2, 1, or even less than 1. With reference to the procedure described above for measuring (approximately 200 measurements) and binning (2° bins) the frequencies of fractional trace segment orientations, the repeating, curved micropatterns (e.g., as in FIG. 4) may be designed so as to have a standard deviation of measured frequency per 2 degree bin of less than 5, less than 4, less than 3, less than 2, 1, or even less than 1.

In addition to the uniformity of the distribution of trace segment orientations, the geometry of the conductor micropatterns of the present disclosure can be described in terms of the radius of curvature of the traces. In some cases, the radii of curvature for traces comprising a micropattern are less than 1 centimeter. In some cases, the radii of curvature for substantially all of the traces comprising the mesh pattern are less than 1 centimeter. In some cases, the radii of curvature for traces comprising a micropattern are less than 1 millimeter. In some cases, the radii of curvature for substantially all of the traces comprising the micropattern are less than 1 millimeter. In some cases, the radii of curvature for traces comprising a mesh pattern are between 20 microns and 1 millimeter. In some cases the radii of curvature for substantially all of the traces comprising the micropattern are between 20 microns and 1 millimeter. In some cases, the radii of curvature for traces comprising a micropattern are between 50 microns and 750 microns. In some cases the radii of curvature for substantially all of the traces comprising the micropattern are between 50 microns and 750 microns. In some cases, the radii of curvature for traces comprising a mesh pattern are between 75 microns and 500 microns. In some cases, the radii of curvature for substantially all of the traces comprising the micropattern are between 75 microns and 500 microns. In some cases, the radii of curvature for traces comprising a micropattern are between 100 microns and 400 microns. In some cases, the radii of curvature for substantially all of the traces comprising the micropattern are between 100 microns and 400 microns.

Substrates

Useful substrates that can be used in the present disclosure include glass and polymeric materials. Useful polymeric materials include polymeric films. A polymeric "film" substrate is a polymer material in the form of a flat sheet that is sufficiently flexible and strong to be processed in a roll-to-roll fashion. By roll-to-roll, what is meant is a process where material is wound onto or unwound from a support, as well as further processed in some way. Examples of further processes include coating, slitting, blanking, and exposing to radiation, or the like. Polymeric films can be manufactured in a variety of thicknesses, ranging in general from about 5 µm to 1000 µm. In many embodiments, polymeric film thicknesses range from about 25 µm to about 500 µm, or from about 50 µm to about 250 µm, or from about 75 µm to about 200 µm. Roll-to-roll polymeric films may have a width of at least 12 inches, 24 inches, 36 inches, or 48 inches. Useful polymeric film substrates include, e.g., poly(ethyleneterephthalate), poly(ethylenenaphthalate), polycarbonate, or cellulose triacetate.

Conductor Types

Examples of useful metals for forming the electrically conductive micropattern include gold, silver, palladium, platinum, aluminum, copper, molybdenum, nickel, tin, tungsten, alloys, and combinations thereof. Optionally, the conductor can also be a composite material, e.g., a metal-filled polymer. The conductor can be reflective, as in the case of thin film metal, such as thin film silver, thin film aluminum. Notwithstanding the motivation and the specific benefits of the disclosed micropattern designs for solving problems associated with reflective conductor materials, the micropattern designs are also useful for non-reflective conductors. For example, the conductor can be absorptive and appear dark or black, as in the case of a carbon-filled composite conductor, for example as derived from a printable carbon-based conductive ink. This disclosure is not limited with respect to the selection or design of the material that comprises the conductor. However, the concepts developed herein have been found to be particularly useful when reflective conductor patterns are needed or otherwise preferred.

Conductive micropatterns may comprise dots, traces, filled shapes, or combinations thereof with defined specular reflectance, for example measured at angle normal to the micropattern. The specular reflectance of smooth thin film metals such as silver or aluminum may exceed 90% in the visible spectrum. In some embodiments, the reflectance of traces for micropatterns formed by a plurality of traces defining a plurality of cells (e.g., to define a micropattern) is less than 90%, measured at normal incidence and in a direction oriented toward the surface of a substrate onto which the traces are disposed. In some embodiments, the reflectance of traces for micropatterns formed by a plurality of traces defining a plurality of cells (e.g., to define a mesh) is less than 90%, measured at normal incidence and in a direction oriented away from the surface of a substrate onto which the traces are disposed. In some embodiments, the reflectance of traces for micropatterns formed by a plurality of traces defining a plurality of cells (e.g., to define a mesh) is less than 50%, measured at normal incidence and in a direction oriented toward the surface of a substrate onto which the traces are disposed. In some embodiments, the reflectance of traces for micropatterns formed by a plurality of traces defining a plurality of cells (e.g., to define a mesh) is less than 50%, measured at normal incidence and in a direction oriented away from the surface of a substrate onto which the traces are disposed. In some embodiments, the reflectance of traces for micropatterns formed by a plurality of traces defining a plurality of cells (e.g., to define a mesh) is less than 20%, measured at normal incidence and in a direction oriented toward the surface of a substrate onto which the traces are disposed. In some embodiments, the reflectance of traces for micropatterns formed by a plurality of traces defining a plurality of cells (e.g., to define a mesh) is less than 20%, measured at normal incidence and in a direction oriented away from the surface of a substrate onto which the traces are disposed. In some embodiments, the reflectance of traces for micropatterns formed by a plurality of traces defining a plurality of cells (e.g., to define a mesh) is less than 10%, measured at normal incidence and in a direction oriented toward the surface of a substrate onto which the traces are disposed. In some embodiments, the reflectance of traces for micropatterns formed by a plurality of traces defining a plurality of cells (e.g., to define a mesh) is less than 10%, measured at normal incidence and in a direction oriented away from the surface of a substrate onto which the traces are disposed. Means for reducing the reflectance of a metallic conductor pattern are known, and include partial reaction of the metal surface to convert it chemically to a light-absorbing compound. One example of the latter is partial conversion of a silver micropattern surface to silver sulfide by exposure to hydrogen sulfide gas or sulfurated potash (liver of sulfur) solution. Similar procedures can be carried out to convert a copper surface to a black sulfide reaction product.

Method of Making the Conductor Micropatterns

Conductor micropatterns having the disclosed designs can be prepared using any suitable method. Examples of methods for preparing conductor micropatterns include subtractive or additive methods. Exemplary subtractive methods include placement of a patterned mask on a metallic coating disposed on a substrate (e.g., a visible light transparent substrate), followed by selective etching (with metal being removed from regions of the metallic coating that are not covered by the mask forming an open area, and with metal remaining forming traces in regions of the metallic coating that are covered by the mask). Suitable masks include photoresist (patterned by photolithography, as is known in the art), printed polymers, or printed self-assembled monolayers (e.g., printed using microcontact printing). Other exemplary subtractive methods include initial placement of a patterned lift-off mask on a substrate (e.g., a visible light transparent substrate), blanket coating of masked and unmasked regions with a metallic conductor (e.g., thin film metal), and washing of the lift-off mask and any metal disposed thereon. Exemplary additive processes include printing of electroless deposition catalyst on a substrate (e.g., visible light transparent substrate) in the form of the desired micropattern geometry, followed by patterned electroless metal deposition (e.g., copper or nickel). Preferred methods for generating the conductor micropatterns include microcontact printing.

Method of Making a Making an Article Using Micropattern Conductors

A conductor micropattern disposed on a surface of a substrate is useful for making a number of different articles. Components that comprise transparent conductive micropatterns include touch sensor panels for touch displays. Some touch sensor panels for touch displays, for example some touch sensor panels that are suitable for combination with electronics that utilize mutual capacitance mode detection and that may include multi-touch resolution capability, include two or more conductor patterns that are overlaid. Two or more conductor patterns that are overlaid can be generated by laminating two substrates together with a clear adhesive, each substrate having disposed on one its major surfaces a conductor micropattern according to the present disclosure. Such laminated articles can be visible light transparent when the substrates are transparent and when the conductor micropattern have high open area fraction. Examples of suitable substrates for forming laminated constructions include the polymeric film substrates listed above.

Examples of suitable adhesive materials for forming laminated constructions are optically clear adhesive that exhibit an optical transmission of at least about 90%, or even higher, and a haze value of below about 5% or even lower. Optical transmission and haze can be measured by disposing it between a 25 micrometer Melinex® polyester film 454 (from DuPont Company, Wilmington, Del.) and a A 75×50 millimeter plain micro slide (a glass slide from Dow Corning, Midland, Mich.) using a Model 9970 BYK Gardner TCS Plus Spectrophotometer (from BYK Gardner, Columbia, Md.). Suitable optically clear adhesive may have antistatic properties, is compatible with metal-based conductors, may be able to be released from the glass substrate by stretching the adhesive described in Illustrative optically clear adhesive include those described in PCT International Publication No. WO 2008/128073 relating to antistatic optically pressure sensitive adhesive, U.S. Patent Application Publication Nos. US 2009-030084 A1 relating to stretch releasing optically clear pressure sensitive adhesive, US 2010-0028564 A1 relating to antistatic optical constructions having optically transmissive adhesive, PCT International Publication Nos. WO 2009/114683 relating to optically clear stretch release adhesive tape, WO 2010/019528 relating to adhesives compatible with corrosion sensitive layers, and WO 2010/078346 stretch release adhesive tape. In one embodiment, the optically clear adhesive has a thickness of about 5 µm or less.

A substrate having the conductor micropattern disposed thereon, or alternatively a laminate comprising two or more substrates having the conductor micropatterns disposed thereon, can be further laminated to a display, for example a liquid crystal display (LCD), an organic light-emitting diode (OLED) display, a plasma display panel (PDP), an electophoretic display (EP), or an electrowetting display. Such a substrate or laminate can be laminated to the display using the referenced adhesive materials. A substrate having the conductor micropattern disposed thereon, or alternatively a laminate comprising two or more substrates having the conductor micropatterns disposed thereon, can be further laminated to another material, for example a rigid support such as a thick (e.g., 1 millimeter) polymer sheet or glass sheet. Examples of rigid supports include the lenses of mobile handheld devices such as mobile phones or smart phones.

In some embodiments, a conductor micropattern as described herein is disposed on more than one side of a substrate, for example on each major surface of a flat substrate that may be flexible or rigid, as already described. For applications that require two conductor micropatterns that are nominally parallel in orientation and spaced apart in the direction normal to the micropatterns, it may be advantageous for the two micropatterns to be disposed on each side of the same flat substrate, for example on each side of a polymer film.

Applications

In some embodiments, the articles described herein comprise a conductor micropattern comprising non-linear traces defining an open micropattern of a cell geometry disposed on or in a visible light transparent substrate. In some such embodiments, the conductor micropattern forms at least a portion of an EMI shield. In some such embodiments, the conductor micropattern forms at least a portion of an antenna. In some such embodiments, the conductor micropattern forms at least a portion of a touch sensor (for example a touch screen sensor). In some such embodiments, the conductor micropattern forms at least a portion of a display electrode, for example a counterelectrode, for example a counterelectrode in an electrophoretic display.

In some embodiments, the articles described herein comprise a first conductor micropattern comprising non-linear traces defining a first open micropattern of a cell geometry disposed on or in a visible light transparent substrate and a second conductor micropattern comprising non-linear traces defining a second open micropattern of a cell geometry electrically isolated from the first conductor micropattern. The second conductor micropattern may be disposed on the same substrate as the first conductor micropattern, or it may be disposed on another substrate. The second conductor micropattern overlays the first conductor micropattern.

In some embodiments, both conductor micropatterns form at least a portion of a touch sensor, for example a touch screen sensor.

In some embodiment, both conductor micropatterns form at least a portion of an electrophoretic display.

Alternatively, in another embodiment, one of the conductor micropatterns forms at least a portion of a touch sensor, for example a touch screen sensor, and the other conductor micropattern may function as an antenna for wireless communication.

In yet another embodiment, one of the conductor micropatterns forms at least a portion of a touch sensor, for example a touch screen sensor, and the other conductor micropattern may function as an electromagnetic interference (EMI) shield.

In yet another embodiment, one of the conductor micropatterns forms at least a portion of an antenna for wireless communication and the other conductive micropattern may function as an electromagnetic interference (EMI) shield.

In some embodiments, a touch screen sensor is provided comprising two visible light transparent substrates, each substrate having opposing first and second surface. A conductor micropattern is disposed on first surface of each of the first and second substrates. Each conductor micropattern comprising a plurality of traces defining a plurality of open area cells. Each conductor micropattern has an open area fraction greater than 80% and a uniform distribution of trace orientation. Each of the traces is non-linear and has a trace width from 0.5 to 10 micrometer. For some touch screen sensors, the conductor micropatterns of first and second substrates are electrically isolated from one another. With regard to the assembly of such a touch screen sensor, the sensor further comprises an optically clear adhesive disposed between two substrates such that the optically clear adhesive is in direct contact with the conductor micropattern of a first substrate and a second surface of the second substrate.

EXAMPLES

Substrate

In all examples herein, a visible light transparent substrate of polyethylene terephthalate ("PET") having a thickness of approximately 125 micrometers, commercially available as product number ST504 from E.I. du Pont de Nemours, Wilmington, Del. was used.

Conductor

In all examples herein, "Sputtered Ag" (approximately 5 angstroms of titanium followed by 100 nanometers of silver, deposited by well-known sputtering methods) was used.

The average percent reflection (% R) was used to measure both major surfaces of the PET substrate using a BYK Gardner color guide sphere.

One sample of each film was prepared by applying Yamato Black Vinyl Tape #200-38 (commercially available from Yamato International Corporation, Woodhaven, Mich.) to the opposite side of the measuring surface using a roller to minimize trapping air bubbles. To measure the surface total percent reflection (specular and diffuse), the non-taped side of the sample was placed against an aperture of BYK Gardiner color guide sphere. The % reflection was measured at 10° incident angle for the wavelength range of 400 to 700 nm. Note that when reflectivity is measured from the bare side (i.e., opposite the conductor-coated side), the measured reflectivity includes reflection from the interface between the substrate film and air. The % R as measured from the coated metal surface was 93.7% and 88.7% from the substrate side.

The silver coating used in each geometry for examples C1, C2, 3 and 4 was patterned by printing octadecylthiol self-assembled monolayer mask on its surface, followed by wet chemical etching, as described in U.S. Patent Application Publication No. US 2009/0218310.

Micropatterns

A number of different geometries, or designs, were used for the conductor micropatterns, as listed in TABLE 1. Each of the designs included a mesh of conductive traces. The designs varied from each other in terms of the shapes of the cells making up the mesh, as well as the orientations and curvature of the traces that defined the mesh and the cells. The regular hexagon design included a regular hexagonal mesh with diameter (distance across the hexagon from face to parallel face) or pitch of 200 micrometers and a uniform trace width of approximately 2 micrometers (98% open area fraction), as illustrated in FIG. 1 (Example C1). The pseudorandom hexagon design included six-sided cells having straight edges and pseudorandom distortions created by displacement of the vertices of the mesh, as illustrated in FIG. 2 (Example C2). The partially curved design included six-sided cells with approximately curved traces, as illustrated in FIG. 3 (Example 3). The non-linear traces were generated by distorting the mid-points of the sides of a 200 micrometer diameter hexagon of the regular hexagon design by 10 micrometers. The fully curved design included six-sided cells with non-linear traces, as illustrated in FIG. 4 (Example 4). The non-linear traces were defined to be generally in the shape of semicircles. The pseudorandom curved design is illustrated in FIG. 5 (Example 5). All of the designs have an open area fraction of 98% and trace widths of 2 micrometers. All of the designs can be generated using standard methodologies of computer-aided drafting and design.

Characterization of the Articles

Laminated articles having one or more conductor micropatterns were evaluated for the conspicuity of their micropatterns under sunlight illumination. The evaluation included visual inspection without magnification (unaided eye). The samples were further imaged using a digital camera (iPhone 3GS, Apple Computer Corp, Cupertino, Calif.). The sunlight illumination upon each sample was first attenuated by passage through a typical commercial architectural double-pane insulated glass unit window having a semi-reflective energy-management film applied, in order to reduce the intensity of light reaching the eye or the camera to a more suitable level for viewing or recording. A number of visual effects contributed to the conspicuity of the various micropatterns. A first such visual effect category is described herein as "starburst," which takes the form of a bright reflective pattern in the shape of a multi-pointed star when illuminated with bright (non-diffuse) sunlight. A regular hexagonal mesh can give rise to a six-pointed starburst. A regular square mesh can give rise to a four-pointed starburst. A second visual effect category is described herein as "rainbow," which takes the form of a band of reflection exhibiting a spectrum of colors along the band when illuminated with bright (non-diffuse) sunlight. A third visual effect category is described herein as "colored halo," which takes the form of diffuse pink and green halos that surround the point of direct specular reflection when illuminated with bright (non-diffuse) sunlight. A fourth visual effect category is described herein as "sparkle," which takes the form of bright points of light across the micropattern when illuminated with bright (non-diffuse) sunlight.

TABLE 1 gives results for visual evaluation of the conductor micropattern samples. TABLE 1 also gives results for sheet resistance (electrical) and transmitted optical measurements of the conductor micropattern samples. Sheet resistance was measured using a Delcom 717 Conductance Monitor (Delcom Instruments, Prescott, Wis.).

TABLE 1

|  | C1 | C2 | 3 | 4 |
|---|---|---|---|---|
|  | Micropattern | | | |
|  | Regular hexagon | Pseudorandom hexagon | Partially curved hexagon | Fully curved hexagon |
| Starburst score | ⊗ | ⊕ | ⊕ | ⊕ |
| Rainbow score | ⊗ | ⊕ | ⊕ | ⊕ |
| Colored halo score | ⊕ | ⊕ | ⊕ | ⊕ |
| Sparkle score | ⊕ | ⊗ | ⊕ | ⊕ |
| Sheet resistance (ohm/sq) | 30 | 28 | 20 | 33 |

The data in TABLE 1 in terms of score for starburst, rainbow, sparkle and colored halo are reported in terms of an acceptable visual appearance score, represented by ⊕, and an unacceptable visual appearance score ⊗. In determining the score, an acceptable score did not imply a total absence of the visual artifact (whether it is a starburst, rainbow, halo or sparkle) but, if present, the level of the artifact is at a level where it may be acceptable to a user. For example, some starburst exists for Example 3, however the starburst for Example Comparative C1 persists over a fairly wide range of observation angles, and the starburst transitions to rainbow bands (the combination existing up to a micropattern tilt of over 40 degrees from perpendicular to the colliminated light source). The starburst for Example 3 persists over a much narrower range of angles (less than 5 degrees tilt from perpendicular to the colliminated light source), and it transitions to a weak halo. The same scoring system is applied to the Examples C6 and 7, below.

Touch Sensor Elements and Systems

Figure 11:
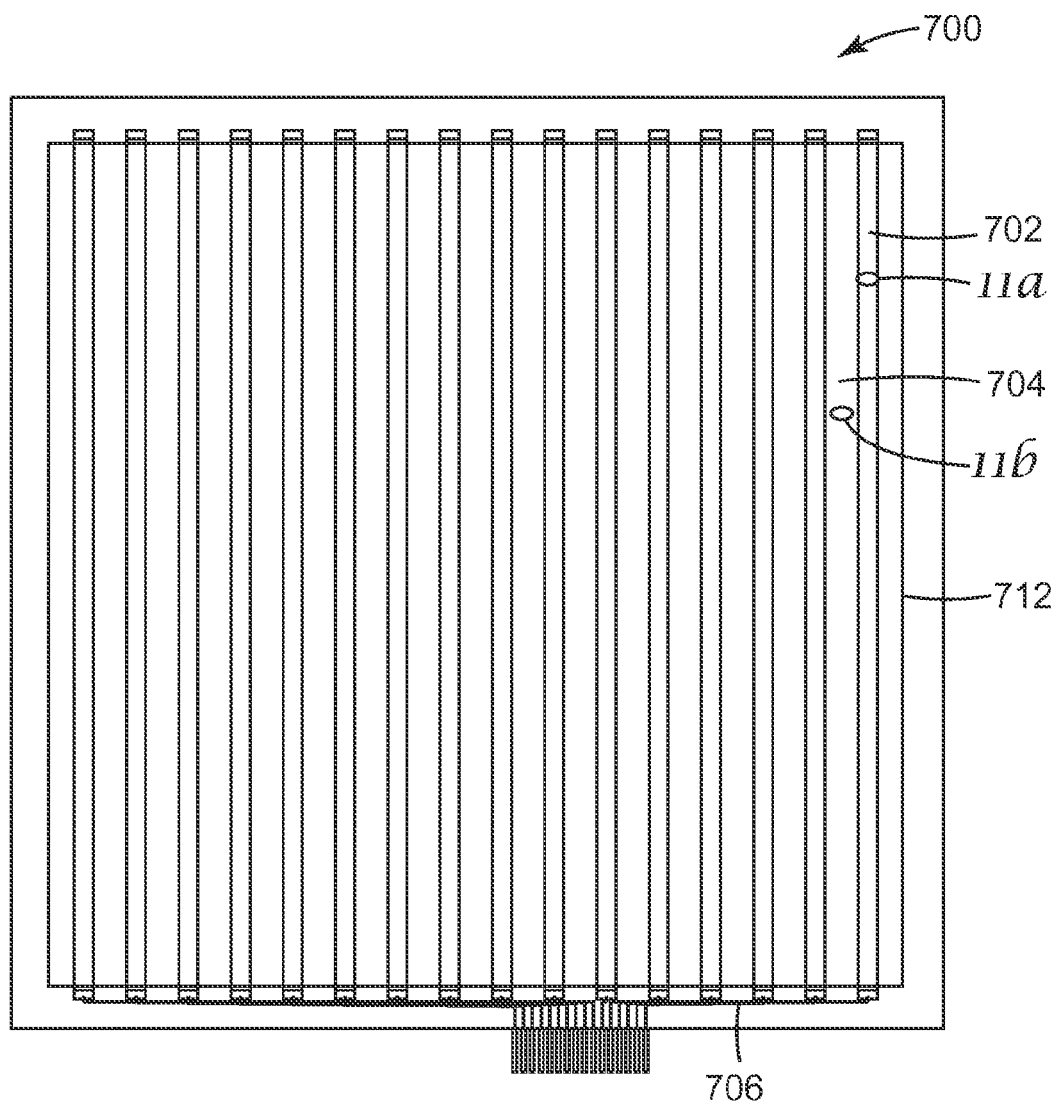
FIGS. 11, 11a and 11b show various portions of a first micropatterned substrate useful for integration into a device, such as a display.
Figure 12:
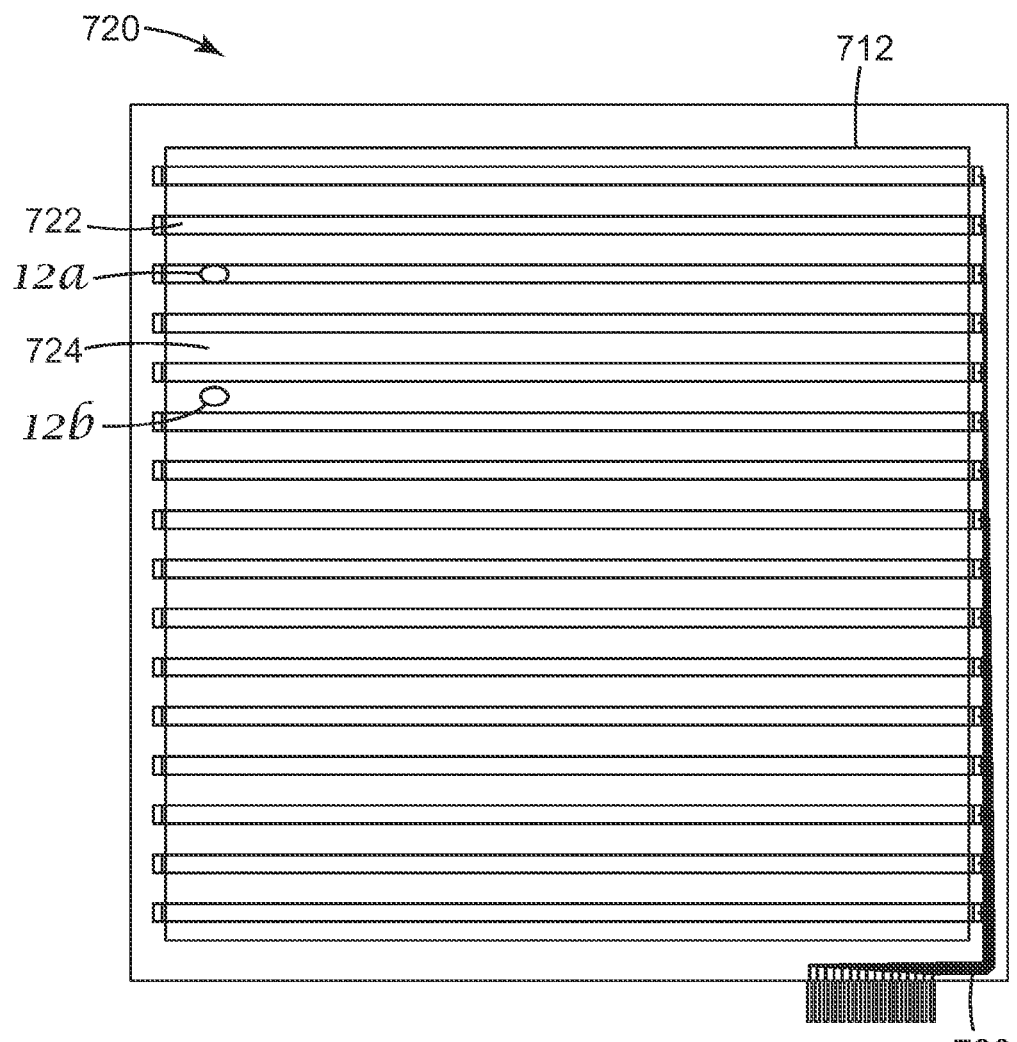
FIGS. 12, 12a and 12b show various portions of a second micropatterned substrate useful for integration into a device, such as a display.
Figure 13:
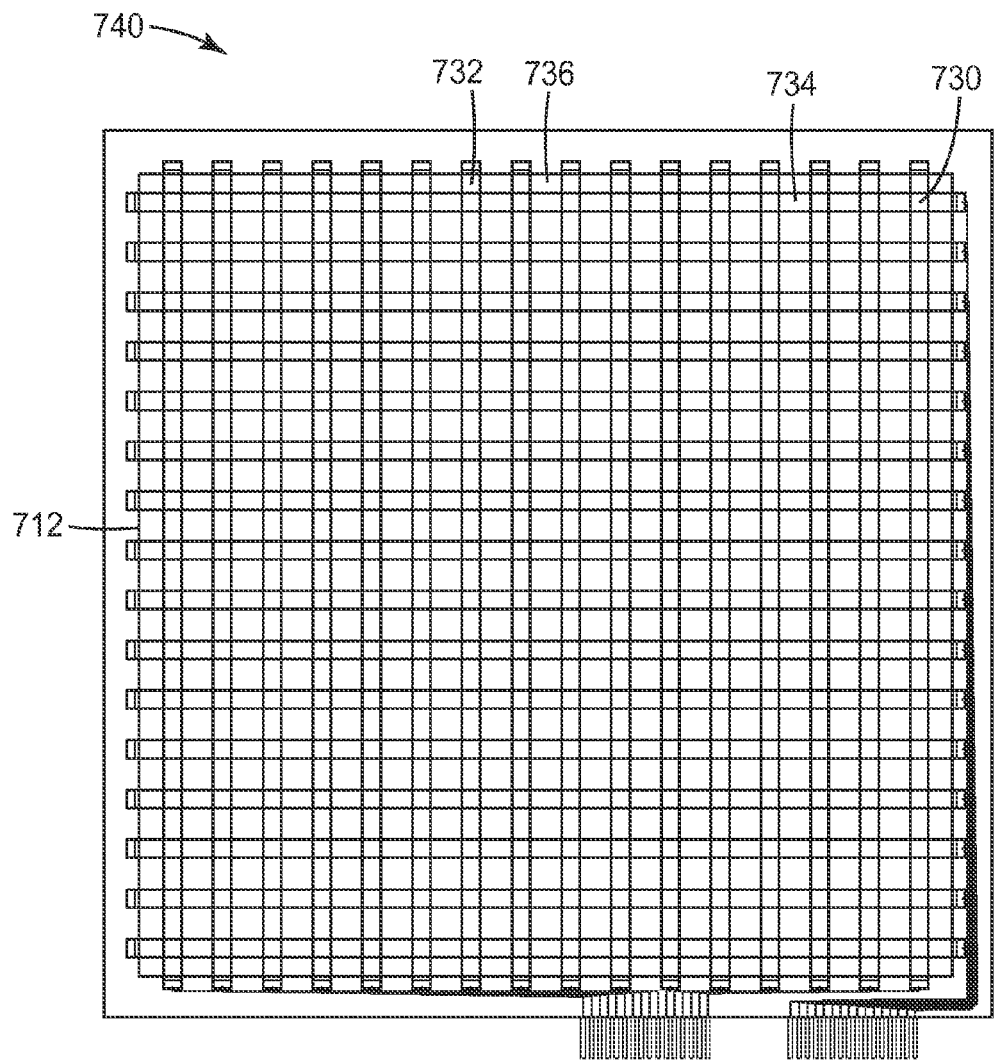
FIG. 13 shows the overlay of the first and second micropatterned substrate that can be integrated into a device.

Transparent sensor elements were fabricated and combined with a touch sensor drive device as generally shown in FIGS. 11, 12 and 13. The device was then integrated with a computer processing unit connected to a display to test the device. The device was able to detect the positions of multiple single and or simultaneous finger touches, which was evidenced graphically on the display. Furthermore, the transparent sensor elements of Examples C6 and 7 were visually evaluated and scored in different categories of conspicuity, as described above. TABLE 2 gives results from visual evaluation of the touch sensor elements.

Example C6

Formation of a Transparent Sensor Element

First Patterned Substrate

A first visible light substrate made of polyethylene terephthalate (PET) having a thickness of 125 micrometers (μm) was vapor coated with an adhesion promotion layer of titanium (on the order of 5 angstroms) and then a 100 nm silver thin film, using a sputter coater to yield a first silver metalized film. The PET was commercially available as product number ST504 from E.I. du Pont de Nemours, Wilmington, Del.

Figure 11A:
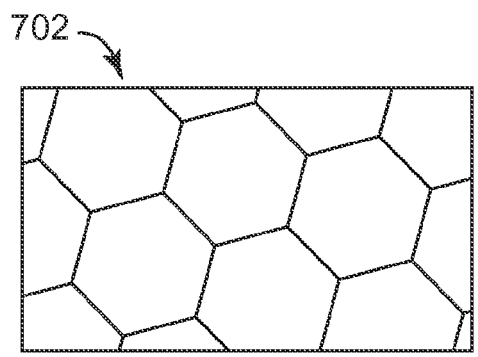
Figure 11B:
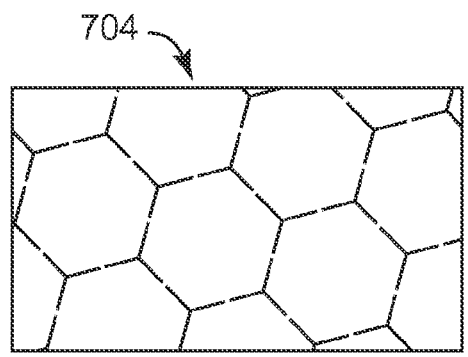

A conductor micropattern was generated on the substrate by printing an octadecylthiol self-assembled monolayer mask on the silver surface, followed by wet chemical etching of the silver, as described in U.S. Patent Application US 20090218310. FIGS. 11, 11a and 11b show a first patterned substrate 700 having a plurality of first continuous regions 702 alternating between a plurality of first discontinuous regions 704 on a first side of the substrate, which is the side that contained the now etched and patterned silver metalized film. The substrate has an opposing second side that is substantially bare PET film. Each of the first regions 702 has a corresponding 65 micrometer wide conductive trace 706 disposed at one end. FIG. 11a shows an exploded view of the first region 702 having a plurality of continuous lines forming a Regular Hex mesh structure. FIG. 11b shows an exploded view of the first discontinuous region 704 having a plurality of discontinuous lines (created using selective breaks, approximately 5 μm wide, in each trace) forming a discontinuous (or broken) regular hexagonal micropattern. Each mesh structure of regions 702 and 704 had approximately 98% open area. Each line segment had a width of approximately 2 μm. The average with of the cells, from face to face, was approximately 200 μm. The intended sensing area 712 was 10 centimeters by 10 centimeters. The continuous regions 702 were in the form of bars measuring 2.2 millimeters wide and arranged with a pitch of 6 millimeters.

Second Patterned Substrate

The second patterned substrate was made as the first patterned substrate using a second visible light substrate to produce a second silver metalized film. A second stamp was produced having a second continuous hexagonal mesh pattern interposed between a second discontinuous hexagonal mesh pattern.

Figure 12A:
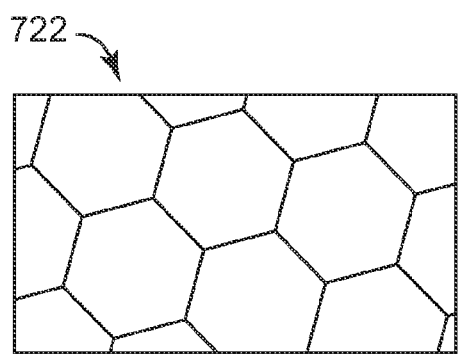
Figure 12B:
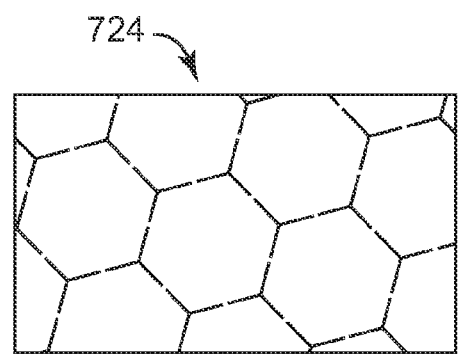

FIGS. 12, 12a and 12b show a second patterned substrate 720 having a plurality of second continuous regions 722 alternating between a plurality of second discontinuous regions 724 on a first side of the second substrate. Each of the second regions 722 has a corresponding 65 micrometer wide second conductive trace 726 disposed at one end. FIG. 12a shows an exploded view of one second region 722 having a plurality of continuous lines forming a Regular Hex mesh structure. FIG. 12b shows an exploded view of one second discontinuous region 724 having a plurality of discontinuous lines (created using selective breaks, approximately 5 μm wide, in each trace) forming discontinuous (or broken) Regular Hex mesh structure. Each mesh structure of region 722 and 724 had approximately 99% open area. Each line segment had a width of approximately 2 μm. The average with of the cells, from face to face, was approximately 300 μm. The intended sensing area 712 was 10 centimeters by 10 centimeters. The continuous regions 722 were in the form of bars measuring 2.2 millimeters wide and arranged with a pitch of 6 millimeters.

Formation of a Projected Capactive Touch Screen Sensor Element

The first and second patterned substrates made above were used to produce a two-layer projected capacitive touch screen transparent sensor element as follows.

The first and second patterned substrates were adhered together using Optically Clear Laminating Adhesive 8141 from 3M Company, St. Paul, Minn. to yield a multilayer construction. A handheld roller was used to laminate the two patterned substrates with the regions of the first and second conductive trace regions 706 and 726 being adhesive free. The multilayer construction was laminated to a 1 mm thick float glass using Optically Clear Laminating Adhesive (product designation 8172 from 3M Company, St. Paul, Minn.) such that the first side of the first substrate was proximate to the float glass. The adhesive free first and second conductive trace regions 706 and 726 allowed electrical connection to be made to the first and second patterned substrates 700 and 720.

FIG. 13 shows a top plan view of a multilayer touch screen sensor element 740 where the first and second patterned substrate have been laminated. Region 730 represented the overlap of the first and second continuous regions. Region 732 represented the overlap of the first continuous region and the second discontinuous region. Region 734 represented the overlap of the second continuous region and the first discontinuous region. And, region 736 represented the overlap between the first and second discontinuous regions. While there was a plurality of these overlap regions, for ease of illustration, only one region of each has been depicted in the figure. The intended sensing area 712 was 10 centimeters by 10 centimeters. The orientation of the mesh disposed on the first substrate was rotated approximately 30 degrees with respect to the orientation of the mesh on the second substrate.

Formation of a Projected Capacitive Touch Sensor System

The electronics used to drive the sensor elements are described in U.S. Patent Application Publication No. 2010/0300773 "High Speed Multi-Touch Device and Controller Therefor." Use of the system included setting a number of calibration values, as is known in the art. These calibration values can vary from touch screen to touch screen. The system could drive 16 different bars (columns) and measure 16 different bars (rows). While the sampling from above was constantly running, a microcontroller was also sending the data to a computer with monitor via a serial interface. This serial interface allowed a simple computer program, as are known to those of skill in the art, to render the raw data from the electronics and see how measured values associated with mutual capacitance between each column and each bar were changing between a touch and no touch. The computer program rendered a three-dimensional bar chart that included bar color-coating across the display, depending on the magnitude of mutual capacitance changes. Taller bars in the bar chart and color progression from blue to aqua to green to yellow to orange to red were associated with greater magnitudes of mutual capacitance change (for example, as resulting from a touch event at a given location).

Results of Testing of the System

The transparent sensor element was connected to the touch sensor drive device. When a finger touch was made to the glass surface, the computer monitor rendered the position of touch that was occurring within the touch sensing region in the form of a taller bar and red coloration. When two finger touches were made simultaneously to the glass surface, the computer monitor rendered the positions of touches that were occurring within the touch sensing region in the form of taller bars and color change to red in the corresponding locations of the monitor. When three finger touches were made simultaneously to the glass surface, the computer monitor rendered the positions of touches that were occurring within the touch sensing region in the form of taller bars and color change to red in the corresponding locations of the monitor.

Comparative Example C6

A transparent sensor element having a micropattern of FIG. 1 (regular hexagon) was fabricated as generally described above in the Formation of a Sensor Element section. The sensor element then combined with a touch sensor drive device as generally shown in FIGS. 11, 12 and 13. The device was then integrated with a computer processing unit connected to a display to test the device. The device was able to detect the positions of multiple single and or simultaneous finger touches, which was evidenced graphically on the display.

Example 7

A transparent sensor element having the micropattern of FIG. 3 (non-linear micropattern—partially curved hexagon) was fabricated and combined with a touch sensor drive device as generally described. All other aspects of the sensor and system were identical to those described for Example 6C, including the selective placement of 5 micrometer wide breaks in order to generate discontinuous regions. The transparent sensor element was connected to the touch sensor drive device. The device was then integrated with a computer processing unit connected to a display to test the device. The device was able to detect the positions of multiple single and or simultaneous finger touches, which was evidenced graphically on the display.

Example 8

A transparent sensor element may be fabricated and combined with a touch sensor drive device as generally described for Comparative Example 6, except that the micropattern of FIG. 4 is substituted for micropattern of FIG. 1.

TABLE 2

Results of visual inspection for touch sensor element examples

| Example | Starburst Score | Rainbow Score | Colored Halo Score |
|---|---|---|---|
| Comparative Ex. 6 | ⊗ | ⊗ | ⊕ |
| 7 | ⊕ | ⊕ | ⊕ |

What is claimed is:

1. An article comprising:
   a substrate having opposing first and second surfaces; and
   a conductor micropattern disposed on the first surface of the substrate, the conductor micropattern comprising a plurality of traces defining a plurality of cells,
   wherein the conductor micropattern has an open area fraction greater than 80% and a uniform distribution of trace orientation;
   wherein each of the traces is non-linear and has a trace width from 0.5 to 10 micrometer; and
   wherein the uniform distribution of trace orientation for the micropattern has a standard deviation of measured frequency per two degree bin of less than four.

2. The article of claim 1, wherein each of the conductor micropattern trace has a radius of curvature of less than 1 centimeter.

3. The article of claim 1, wherein each of the traces has a trace width from 0.5 to 5 micrometer.

4. The article of claim 1, wherein each of the traces has a trace width from 1 to 3 micrometer.

5. The article of claim 1, wherein the uniform distribution of trace orientation for the micropattern has a standard deviation of measured frequency per two degree bin of less than three.

6. The article of claim 1, wherein the uniform distribution of trace orientation for the micropattern has a standard deviation of measured frequency per two degree bin of less than two.

7. The article of claim 1, wherein the uniform distribution of trace orientation for the micropattern has a standard deviation of measured frequency per two degree bin of less than one.

8. The article of claim 1, wherein the trace comprises a material selected from the group consisting of gold, silver, palladium, platinum, aluminum, copper, molybdenum, nickel, tin, tungsten, alloys, and combinations thereof.

9. The article of claim 1, wherein the conductor micropattern has a non-repeating cell geometry.

10. The article of claim 1, wherein the conductor micropattern has a repeating cell geometry, the cell comprising six sides.

11. The article of claim 1, wherein the conductor micropattern has a non-repeating cell geometry, the cell comprising four sides.

12. The article of claim 1, wherein the conductor micropattern has cells that do not lie on a repeating array of positions.

13. The article of claim 1, wherein traces have a specular reflectance of less than 20% at normal incidence and in a direction oriented toward the first surface of the substrate.

14. The article of claim 1, wherein the traces have a specular reflectance of less than 10% at normal incidence and in a direction oriented toward the first surface of the substrate.

15. The article of claim 1, wherein the traces have a specular reflectance of less than 50% at normal incidence and in a direction oriented toward the first surface of the substrate.

16. The article of claim 1, wherein the traces have a specular reflectance of less than 20% at normal incidence and in a direction oriented away from the first surface of the substrate.

17. The article of claim 1, wherein the traces have a specular reflectance of less than 10% at normal incidence and in a direction oriented away the first surface of the substrate.

18. The article of claim 1, wherein the traces have a specular reflectance of less than 50% at normal incidence and in a direction oriented away the first surface of the substrate.

19. The article of claim 1, wherein the substrate is visible light transparent.

20. The article of claim 12, wherein the substrate is selected from the group consisting of glass and plastic.

21. The article of claim 1 further comprising
   a second conductor micropattern disposed on the second surface of the substrate, the second conductor micropattern comprising a plurality of traces defining a plurality of cells,
   wherein the second conductor micropattern has an open area fraction greater than 80% and a uniform distribution of trace orientation; and
   wherein each of the traces is non-linear and has a trace width from 0.5 to 10 micrometer.

22. A touch screen sensor comprising:
- first and second substrates, each substrate having opposing first and second surfaces;
- a conductor micropattern disposed on first surface of each of the first and second substrates, both conductor micropatterns comprising a plurality of traces defining a plurality of open area cells,
- wherein the conductor micropatterns have an open area fraction greater than 80% and a uniform distribution of trace orientation having a standard deviation of measured frequency per two degree bin of less than four,
- wherein each of the traces is non-linear and has a trace width from 0.5 to 10 micrometer; and
- wherein the conductor micropatterns of first and second substrates are electrically isolated from one another.

23. The touch screen sensor of claim 22 further comprising an optically clear adhesive disposed between the first and second substrates such that the optically clear adhesive is in direct contact with the conductor micropattern of the first substrate and the second surface of the second substrate.

24. The touch screen sensor of claim 22, wherein the uniform distribution of trace orientation has a standard deviation of measured frequency per two degree bin of less than three.

25. The touch screen sensor of claim 22, wherein the uniform distribution of trace orientation has a standard deviation of measured frequency per two degree bin of less than two.

26. The touch screen sensor of claim 22, wherein the uniform distribution of trace orientation has a standard deviation of measured frequency per two degree bin of less than one.

* * * * *